(12) United States Patent
Kononchuk

(10) Patent No.: US 7,531,430 B2
(45) Date of Patent: May 12, 2009

(54) METHOD FOR PRODUCING A SEMICONDUCTOR-ON-INSULATOR STRUCTURE

(75) Inventor: Oleg Kononchuk, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 114 days.

(21) Appl. No.: 11/677,179

(22) Filed: Feb. 21, 2007

(65) Prior Publication Data

US 2008/0153313 A1 Jun. 26, 2008

Related U.S. Application Data

(63) Continuation of application No. PCT/IB2006/003958, filed on Dec. 26, 2006.

(51) Int. Cl.
*H01L 21/30* (2006.01)
*H01L 21/46* (2006.01)

(52) U.S. Cl. .................. 438/459; 438/475; 438/407; 257/E21.6; 257/E21.267

(58) Field of Classification Search .............. 438/415, 438/798, 450, 459, 475, 406, 407; 257/E21.606, 257/E21.607, E21.6, E21.267, E21.282, E21.283, 257/E21.284, E21.292
See application file for complete search history.

(56) References Cited

U.S. PATENT DOCUMENTS

| | | | | |
|---|---|---|---|---|
| 4,786,608 | A | 11/1988 | Griffith | 437/24 |
| 5,589,407 | A * | 12/1996 | Meyyappan et al. | 438/766 |
| 5,936,261 | A | 8/1999 | Ma et al. | 257/59 |
| 6,328,796 | B1 | 12/2001 | Kub et al. | 117/94 |
| 6,368,938 | B1 * | 4/2002 | Usenko | 438/407 |
| 6,861,320 | B1 * | 3/2005 | Usenko | 438/305 |
| 2001/0046746 | A1 | 11/2001 | Yokokawa et al. | 438/311 |
| 2003/0064735 | A1 | 4/2003 | Spain et al. | 455/456 |
| 2003/0218212 | A1 * | 11/2003 | Lee et al. | 257/347 |
| 2005/0118789 | A1 | 6/2005 | Aga et al. | 438/459 |
| 2005/0227444 | A1 | 10/2005 | Ponomarev et al. | 438/289 |

(Continued)

FOREIGN PATENT DOCUMENTS

EP    1 583 143    10/2005

(Continued)

OTHER PUBLICATIONS

G. K. Celler et al., "Frontiers of Silicon-on-insulator", Journal of Applied Physics, vol. 93, No. 9, pp. 4955-4978 (2003).

(Continued)

*Primary Examiner*—Caridad M Everhart
(74) *Attorney, Agent, or Firm*—Winston & Strawn LLP

(57) ABSTRACT

The invention relates to a process of treating a structure for electronics or optoelectronics, wherein the structure that has a substrate, a first oxide layer, an intermediate layer, a second oxide layer made of an oxide of a semiconductor material, and a thin semiconductor layer made of the semiconductor material. The process includes a heat treatment of the structure in an inert or reducing atmosphere with a temperature and a duration chosen for inciting an amount of oxygen of the second oxide layer to diffuse through the semiconductor layer so that the thickness of the second oxide layer decreases by a determined value. The invention also relates to a process of manufacturing a structure for electronics or optoelectronics through the use of this type of heat treatment.

20 Claims, 3 Drawing Sheets

U.S. PATENT DOCUMENTS

| | | | |
|---|---|---|---|
| 2006/0051945 A1 | 3/2006 | Yokokawa et al. | 438/526 |
| 2006/0154442 A1 | 7/2006 | De Souza et al. | 438/455 |
| 2007/0161199 A1* | 7/2007 | Morita | 438/311 |

FOREIGN PATENT DOCUMENTS

| | | |
|---|---|---|
| JP | 2000-036445 | 2/2000 |
| JP | 2006-049725 | 2/2006 |

OTHER PUBLICATIONS

Q.Y. Tong et al., "Semiconductor wafer bonding science and technology", published by John Wiley & Sons, New York pp. 1-99 (1999).

K.-Y. Ahn et al., "Stability Of Interfacial Oxide Layers During Silicon Wafer Bonding", Journal of Appl. Phys., vol. 65, No. 2, pp. 561-563 (1989).

Oleg Kononchuk et al., "Internal Dissolution of Buried Oxide in SOI Wafers", Solid State Phenomena, vol. 131-133, pp. 113-118 (2008).

Jim Sullivan et al., "High Temperature Oxygen Out-Diffusion from the Interfacial SiOx Bond Layer in Direct Silicon Bonded (DSB) Substrates", IEEE 2006 International SOI Conference.

A. Misiuk et al., "Effect Of High Temperature—Pressure On SOI Structure", Crystal Engineering, vol. 5, pp. 155-161 (2002).

* cited by examiner

METHOD FOR PRODUCING A SEMICONDUCTOR-ON-INSULATOR STRUCTURE

CROSS-REFERENCE TO RELATED APPLICATIONS

This application is a continuation of International application no. PCT/IB2006/003958 filed Dec. 26, 2006, the entire content of which is expressly incorporated herein by reference thereto.

BACKGROUND

The invention relates to the treatment of Semiconductor-On-Insulator (SeOI) structures for electronics or optoelectronics. Such SeOI structures comprise successively a semiconductor layer made of a semiconductor material (or bulk substrate), an oxide layer made of an oxide of the semiconductor material, and a bulk substrate. It is to be understood that the terms "electronic(s)" and "optoelectronic(s)" relate to any microelectronic, nanoelectronic, optomicroelectronic, optonanoelectronic, components technology made on or in the semiconductor layer.

The invention relates also to the manufacturing of these structures. Such structures are typically manufactured by using a wafer bonding technique, comprising the following steps:

providing a wafer with the semiconductor layer thereon;
providing a bulk substrate;
forming a dielectric layer on the semiconductor layer and/or on the bulk structure;
bonding the wafer with the bulk substrate, such that the dielectric layer is at the bonding interface between the semiconductor layer and the substrate;
reducing the wafer for only keeping the semiconductor layer bonded to the substrate via the dielectric layer, forming thus the SeOI structure; and
heat treating this structure in an atmosphere for reinforcing the bonding links.

In these structures, the dielectric layer is typically an oxide layer and/or a nitride layer. Even though nitride materials have a better resistance to high temperatures than oxide materials, oxide layers are often preferred to nitride layers for their better adhesive and dielectric properties, and also for the electrical quality provided by their interface. After bonding, if the dielectric is an oxide material, the dielectric layer is then a buried layer at the bonding interface, the so-called Buried OXide or BOX layer.

SeOI structures are applied for the manufacturing of electronic or optoelectronic components in the semiconductor layer. The buried dielectric layer allows the semiconductor layer to be electrically insulated from the bulk substrate. The performance of the components is then increased. Furthermore, due to a continuous progress in the field of semiconductors, the components need to be more and more miniaturized and to have lower power consumption and higher speed.

Thus, there is a need for reducing the thickness of both the semiconductor layer and the dielectric layer, while improving the uniformity of their respective thickness. But there are difficulties in manufacturing such thin layers. In particular, during heat treatment, some water and/or contamination particles, trapped during the bonding step at the interface between the two elements to be bonded, can cause internal pressure during heat treatment with a bad interface quality as a result.

If the semiconductor layer of the structure is sufficiently thick (typically more than 5 micrometers), water is absorbed by it, and partly rejected in the atmosphere. Drawbacks due to the presence of these molecules are thus avoided. Also, if the buried dielectric layer is thick enough (typically more than 200 angstroms for a BOX layer), these drawbacks can be also avoided.

Accordingly, it is necessary to have the buried dielectric layer or semiconductor layer that is thicker than their respective thickness limits for avoiding these problems. It is not possible to manufacture a SeOI structure with a semiconductor layer and a dielectric layer respectively thinner than these thickness limits, however, without risking deformation of the semiconductor layer or generating bubbles due to the presence of water. Accordingly, the quality of such a modified thickness semiconductor layer would not be acceptable for the next industrial process to implement.

US patent application 2005/0227444 and European patent application EP 1,583,143 attempt to solve these problems by proposing to manufacture a SOI structure with a thin silicon layer and a thin BOX layer (for "Silicon-On-Insulator" structure) by firstly operating a wafer bonding via a bonding oxide layer sufficiently thick for absorbing the interfacial molecules like for example water and/or hydrogen molecules, and then by reducing the thickness of the BOX layer by heat treating the SOI structure in a Argon or Hydrogen atmosphere. Indeed, oxygen of the BOX layer diffuses through the Si top layer to the surface of the SOI structure. However, this reducing in thickness of the BOX layer can decrease the dielectric quality of the BOX layer and the electrical properties at the interface with the Si top layer. Additionally, the final BOX layer lacks homogeneity in thickness and presents some surface roughness that causes bonding difficulties.

Thus, there remains a need for addressing these problems in a way that does not detract from the other desirable properties of the structure.

SUMMARY OF THE INVENTION

The invention is aimed to overcome these previous problems, found for the manufacturing of thin SeOI with a thin buried dielectric layer, and particularly to those relating to the use of a thin BOX layer. Another goal is to manufacture such a SeOI structure with a BOX layer that has good dielectric properties, good electrical interface with the Si top layer and a good homogeneity in thickness. In particular, the invention is able to control the thickness of the thin or ultra-thin buried oxide layer in a desirable way. Furthermore, the invention decreases the duration of the post-bonding heat-treatment.

In order to provide these advantages and overcome the drawbacks of the prior art, the invention relates to a process for treating a structure for electronics or optoelectronics, which comprises heat treating a structure comprising, successively, a substrate, a first oxide layer, an intermediate layer, a second oxide layer made of an oxide of a semiconductor material, and a thin semiconductor layer made of the semiconductor material, and the process in an inert or reducing atmosphere at a temperature and a time sufficient to incite an amount of oxygen of the second oxide layer to diffuse through the semiconductor layer so that the thickness of the second oxide layer decreases by a predetermined amount. Preferably, the intermediate layer is made of a material and has a thickness chosen for stopping the diffusion of oxygen from the first oxide layer towards the thin semiconductor layer.

Advantageously, the thickness of the semiconductor layer is between around 250 angstroms and around 5,000 angstroms, the heat treating temperature is about 1,200° C. and the treatment time is between around 5 minutes and 5 hours. The second oxide layer typically has a thickness between around 100 angstroms and around 500 angstroms, and the heat treatment is processed so that substantially the whole second oxide layer is removed. Also, the first oxide layer typically has a thickness in the range of 50 to 500 Å and a uniformity around or better than 1%.

A preferred intermediate layer is a nitride of the semiconductor material and has a thickness in the range of 20 to 200 Å. This intermediate layer may instead be of amorphous, polymorphous, monocrystalline, multicrystalline or polycrystalline silicon.

In another embodiment, the invention relates to a process for manufacturing a structure for electronics or optoelectronics applications, which comprises providing a layer of a semiconductor material having a predetermined thickness; providing a receiving wafer comprising successively a substrate, a first oxide layer and a top layer; forming a bonding interface that includes as a bonding layer a second oxide layer made of an oxide of the same semiconductor material as that of the semiconductor layer; bonding the semiconductor layer to the receiving wafer at the bonding interface such that the first oxide layer and top layer are sandwiched between the semiconductor layer and the substrate, thus forming a structure comprising successively the substrate, the first oxide layer, an intermediate layer that includes the top layer, a second oxide layer of the bonding layer, and the semiconductor layer; and heat treating the structure in an inert or reducing atmosphere at a temperature and a time sufficient to diffuse an amount of oxygen from the second oxide layer through the semiconductor layer, wherein the intermediate layer has a thickness sufficient to stop diffusion of oxygen from the first oxide later towards the semiconductor layer. The second oxide layer of the bonding layer may be formed on the intermediate layer, or it can be formed on the thin semiconductor layer. Advantageously, the bonding layer is formed on both the intermediate layer and the semiconductor layer.

The semiconductor layer is preferably provided as part of a donor substrate and the method further comprises reducing the thickness of the donor substrate so that only the semiconductor layer is bonded to the receiving substrate. This is conveniently achieved by implanting atomic species in the donor substrate to form a zone of weakness beneath the semiconductor layer, and supplying energy for detaching the semiconductor layer from the donor structure at the zone of weakness.

Also, the heat treating temperature in this embodiment can be firstly chosen according to a determined profile, and then the predetermined thickness is chosen for determining the duration, or the duration can be chosen for determining the predetermined thickness, these choices being made for reducing the thickness of the oxide layer by a predetermined value. A useful temperature is between 1,100° C. and 1,250° C., such as around 1,200° C. Alternatively, the predetermined thickness and temperature are chosen for having a mean reduction rate of the first oxide layer of at least about 0.5 angstroms per minute.

Thanks to the configuration of the structure, the function of bonding (ensured by the second oxide layer) is separated to the function of electrical insulating (ensured by the first oxide layer). Accordingly, it is possible to have a better control of the formation of each oxide layer so as to optimize their respective bonding and insulating properties. Furthermore, the first oxide layer is preserved from diffusion thanks to the presence of the intermediate layer.

BRIEF DESCRIPTION OF THE FIGURES

Other features and advantages of the invention will appear clearer in reading the description below, which is illustrated by the following drawing figures.

DETAILED DESCRIPTION OF THE PREFERRED EMBODIMENTS

Figure 1:
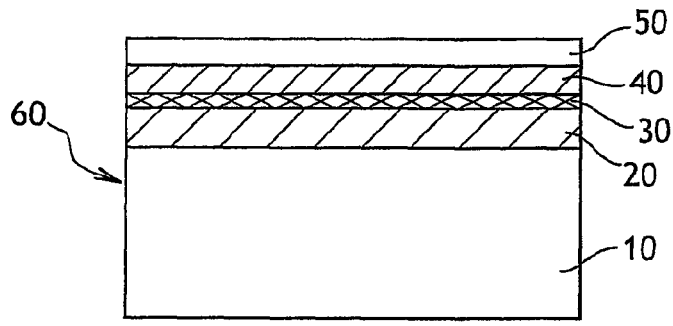
FIG. 1 shows a schematic cross-section view of structure according to the invention.

Referring now to FIG. 1, a structure 60 from which the treatment according to the invention will be processed, is shown. This structure 60 comprises a substrate 10, a first oxide layer 20, an intermediate layer 30, a second oxide layer 40, and a thin semiconductor layer 50. This structure 60 is aimed to be heat treated for dissolving the second oxide layer 40, and obtaining then a SeOI structure comprising the substrate 10, the first oxide layer 20, the intermediate layer 30, and a semiconductor layer 50'. The semiconductor layer 50' comprises the de-oxidized second oxide layer 40 and the thin semiconductor layer 50.

The substrate 10 stiffens the whole structure 60. To this aim, it has a sufficient thickness that is typically on the order of hundreds of micrometers. The substrate 10 may be formed of a single bulk material, like Si, Ge, SiC, GaN, sapphire, glass, quartz, or other materials. Alternatively, the substrate 10 is formed of at least two materials, stacked one onto the other. The semiconductor layer 50 is of at least one semiconductor material.

The semiconductor layer 50 may be of Si, SiC, Ge, SiGe, SiGeC, a Group III-V material, a Group II-VI material or another semiconductor material. The semiconductor layer 50 may alternatively be of a combination or a superposition of at least two of these materials and/or a superposition of several sub-layers. The semiconductor material may be monocrystalline, polycrystalline or amorphous. It may be doped or non-doped, porous or non-porous.

The semiconductor layer 50 is advantageously formed for receiving electronic or optoelectronic components. According to the invention, the semiconductor layer 50 is advantageously thin. Its thickness is advantageously less than about 5,000 angstroms, and in particular less than 2,500 angstroms. For example, the semiconductor layer 50 may have a thickness between around 250 angstroms and 2,500 angstroms, or between around 250 angstroms and 1,200 angstroms. In particular, the thickness of the semiconductor layer 50 may be chosen between 500 and 1,000 angstroms for speeding up the oxygen diffusion process.

The first oxide layer 20 is typically buried in the structure 60, located between the bulk substrate 10 and the intermediate layer 30. The first oxide layer 20 may be made of an oxide of the semiconductor material or of another crystalline material, such as a crystalline material that forms the superficial part of the substrate 10. For example, if the superficial part of the substrate 10 or the semiconductor layer 50 is of Si, the first oxide layer 20 may be of $SiO_2$. Also, the first oxide layer 20 is advantageously thin or ultra-thin.

This first oxide layer 20 is configured for having electrical insulating properties in order to at least partly electrically insulate the electronic or optoelectronic components to be formed in the semiconductor layer 50 from the substrate 10. It is to be understood that this first oxide layer 20 is not configured for further having adhesive properties. Its thickness may be less than 500 angstroms or less. For example, this thickness may be between around 50 angstroms and around 500 angstroms or between around 200 angstroms and around 500 angstroms. Its thickness may also be of a few angstroms such as around 10 Å. Moreover, this first oxide layer 20 is preferably formed for having a uniform thickness, typically around or lower than 1%.

The second oxide layer 40 is buried in the structure 60, located between the intermediate layer 30 and the semiconductor layer 50. The second oxide layer 40 is of an oxide of the semiconductor material. If the semiconductor layer 50 is constituted of several semiconductor sub-layers, the second oxide layer 40 is of an oxide of the semiconductor material of the adjacent sub-layer. For example, if the semiconductor layer 50 is of Si, the second oxide layer 40 is of $SiO_2$.

In contrast to the first oxide layer, this second oxide layer 40 is configured for having adhesive properties. It is to be understood that this second oxide layer 40 is not configured for having electrical insulating properties in order to electrically insulate the electronic or optoelectronic components to be formed in the semiconductor layer 50 from the substrate 10.

This second oxide layer 40 may also be thin, with a thickness chosen to be less than 500 angstroms. For example, this thickness may be between around 100 angstroms and around 500 angstroms or between around 200 angstroms and around 500 angstroms. A thickness chosen between 350 and 500 angstroms may be considered as optimum if the semiconductor layer 50 was initially transferred by bonding (via the second oxide layer 40) and by SMART CUT® process, and if a heat treatment is further implemented for densifying the second oxide layer 40. Indeed, this thickness may be chosen for both ensuring a SMART CUT® technology of good quality (i.e. so as to capture water at the interface) and for allowing a dissolution of the second oxide layer 40 in a relatively short time.

The intermediate layer 30 is preferably configured for stopping the diffusion of oxygen from the first oxide layer 20 towards the semiconductor layer 50. The intermediate layer 30 may be made of a nitride, like a nitride of the semiconductor material, like $Si_3N_4$. The intermediate layer 30 may be made of silicon, e.g. an amorphous, monocrystalline, multicrystalline or polycrystalline silicon. This intermediate layer 30 may be thin or ultra-thin, but thick enough for stopping the diffusion. For example, an intermediate layer 30 of $Si_3N_4$ can have a thickness of a few angstroms, around 10 Å. For an intermediate layer 30 of silicon, the thickness is at least 20 Å to stop the diffusion of oxygen. The thickness can depend on the time and temperature chosen for the heat treatment.

The manufacturing of this structure 60 may be done by a wafer bonding technique, as illustrated on FIG. 2A to 2E, between a first wafer 70 and a second wafer 80. Especially, with reference to FIG. 2A, the manufacturing may be firstly implemented by providing the first wafer 70 with the semiconductor layer 50 within, the semiconductor layer 50 lying at the surface of the first wafer 70 defining a front layer.

The first wafer 70 may be of a single bulk material, the semiconductor layer 50 being then in the bulk material or grown on it. Alternatively, the first wafer 70 may be a composite wafer comprising a holder substrate and a multilayer structure (not shown). In particular, the first wafer 70 can include a buffer structure between the holder substrate and the semiconductor layer 50 arranged for adapting the lattice parameter between these two elements and/or for confining defaults. For example, the first wafer 70 comprises a Si holder substrate, a SiGe buffer layer with a Ge concentration continuously increasing in thickness from the holder, and a SiGe or Ge and/or a strained Si semiconductor layer 50 over it.

Advantageously, the semiconductor layer 50 has been epitaxially grown. Crystalline growth of the epitaxial layer may have been obtained using the known techniques of CVD and MBE (respectively chemical vapor deposition, and molecular beam epitaxy).

Figure 2A:
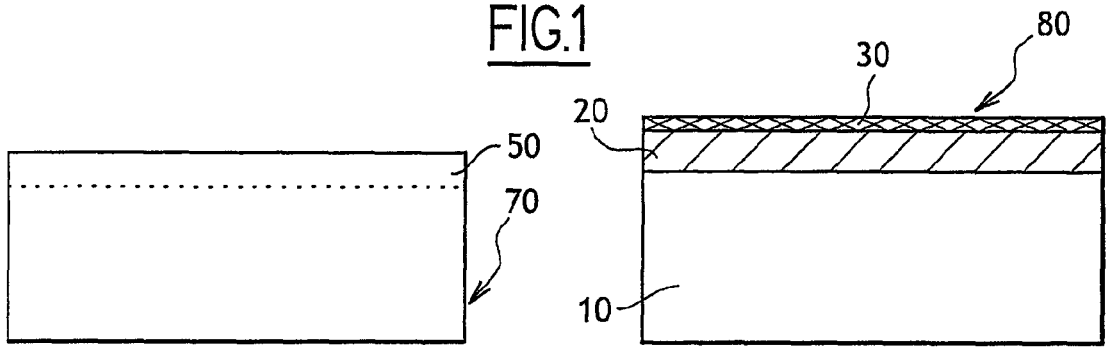
FIG. 2A to 2E show the different steps of a process of manufacturing the structure.
Figure 2B:
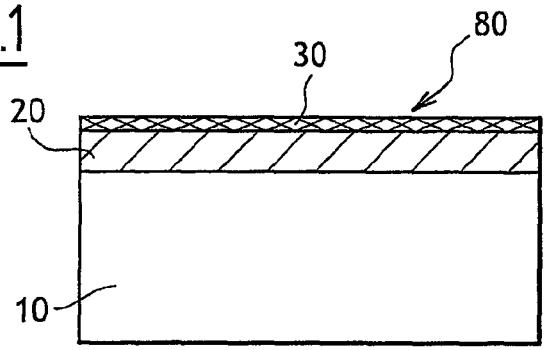

With reference to FIG. 2B, a second step consists of providing a second wafer 80 with the substrate 10, the first oxide layer 20 and the intermediate layer 30, the intermediate layer 30 being a top layer. In a preferred embodiment, the first oxide layer 20 is formed on the substrate 10. The purpose of this oxide formation is to provide a buried dielectric layer with a predetermined thickness for manufacturing, after bonding, a semiconductor-on-insulator (SeOI) structure, the insulator part of this structure being the first oxide layer 20.

The first oxide layer 20 may be formed by oxidation of the substrate 10. For example, if the substrate 10 has a superficial layer made of Si or SiGe, a $SiO_2$ layer 20 may be formed at the surface by oxidation. Alternatively, the first oxide layer 10 may be formed by deposition of aggregates made of the oxide material. For example, $SiO_2$ aggregates may be deposed.

The parameters of the oxide formation (like temperature, gas composition and flow rates pressure) are controlled such that the first oxide layer 20 is a dielectric barrier between the components to manufacture in the semiconductor layer 50 and the substrate 10. Particularly, the material, the thickness, and eventually the intrinsic structure, of it are chosen to this end. It is to be noticed that this first oxide layer 20 is not aimed to be a bonding layer, like in the prior art. Accordingly, the quality of it is better (no defaults trapped at a bonding interface).

Additionally, the oxide formation parameters can be chosen for improving the interface with the substrate 10, lowering the defaults at the interface, and for having a good thickness homogeneity. The thickness of the first oxide layer 20 may then be lower than a standard thickness of a bonding layer.

Advantageously according to the invention, the first oxide layer 20 is thin or ultra-thin. For example, the first oxide layer 20 has a thickness, after bonding, between around 50 angstroms and around 500 angstroms, or between 50 and 200 angstroms.

The intermediate layer 30 is then formed on the first oxide layer 20 by deposition, by CVD for example. Its thickness is chosen equal or greater than a limit thickness beyond which the diffusion of the oxygen from the first oxide layer 20 through the intermediate layer 30 is few or null, considering the temperature and the duration of the heat treatment implemented for the oxide dissolution. This thickness can be chosen of at least 20 Å.

Figure 2C:
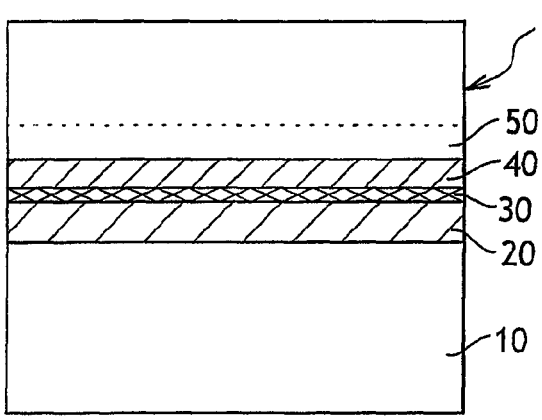

With reference to FIG. 2C, a third step consists in bonding the first wafer 70 to the second wafer 80 such that the semiconductor layer 50 faces the intermediate layer 30. Advantageously, the bonding is firstly implemented by well-known bonding techniques (see, for example, "Semiconductor Wafer Bonding Science and Technology" by Q.-Y. Tong and U.

Gösele—a Wiley Interscience publication, Johnson Wiley & Sons, Inc—for more details). Thus, for example, molecular bonding of hydrophilic surfaces or surfaces rendered hydrophilic may be done.

Well-known cleaning steps may also be implemented just before bonding. Optionally, a plasma treatment of one and/or the other of the two surfaces to be bonded, followed by conventional annealing or RTA treatment (rapid thermal annealing), can be implemented.

With reference to FIG. 2C, the second oxide layer 40 was formed, before bonding, on the semiconductor layer 50 and/or on the intermediate layer 30, for being buried at the bonding interface after bonding. This second oxide layer 40 is formed by specific means on the semiconductor layer 50 and/or on the intermediate layer 30. The second oxide layer 40 may be formed by oxidation of the semiconductor layer 50. For example, if the semiconductor layer 50 is of Si or SiGe, an $SiO_2$ layer 40 may be formed at the surface by oxidation.

Alternatively, the second oxide layer 40 may be formed by deposition of aggregates constituted of the oxide material on the semiconductor layer 50 and/or on the intermediate layer 30. For example, $SiO_2$ aggregates may be deposited.

The parameters of the formation of the oxide are controlled such that the second oxide layer 40 is a bonding layer sufficiently thick for ensuring a sufficient adhesivity between the first and second wafers 70, 80. Especially, if a SMART CUT® technology is planned to be processed in the first wafer 70, the second oxide layer 40 has to be sufficiently thick for avoiding problems associated with water and particles captured at the bonding interface. On the other hand, it is preferable that this thickness being not too high for avoiding that the dissolution heat treatment lasts too much time. The second oxide layer 40 may have a thickness lower than 600 angstroms, or lower than 500 angstroms, or between 200 and 500 angstroms. The preferred thickness is between 350 and 500 angstroms as previously explained.

With further reference to FIG. 2C, the first wafer 70 and the second wafer 80 are bonded together such that the second oxide layer 40 is located at the interface, as previously explained. Optionally, at least one step of heating is additionally implemented for reinforcing the bonds at the interface.

Figure 2D:
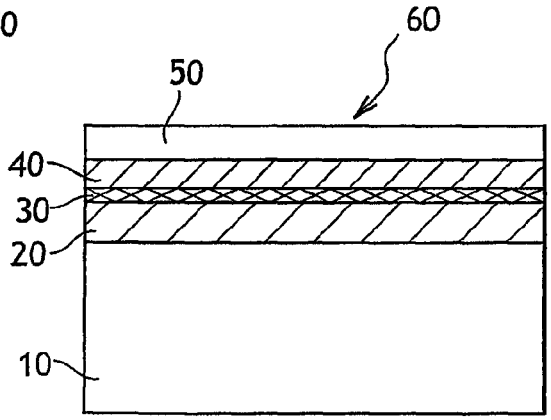

Referring to FIG. 2D, the structure 60 is obtained by reducing the first wafer 70 such that a rear portion is removed. Only the semiconductor layer 50 is kept. Any technique of wafer reduction may be used, such as chemical etching technique, lapping then polishing, SMART CUT® technology which is known per se to the skilled person (see, for example, G. Celler, Frontiers of Silicon-on-Insulator, Journal of Applied Physics, Vol. 93, no. 9, May 1, 2003, pages 4955-4978).

In particular, if using the SMART CUT® technology, the wafer 70 is implanted prior to bonding, with atomic species (such as hydrogen, helium or a combination of the them, and/or other atomic species) at energy and dose selected for producing within a zone of weakness at a depth close to the thickness of the semiconductor layer 50. The implantation may be carried out before or after forming the second oxide layer 40. Finally, once the bonding has been carried out, SMART CUT® technology comprises supplying suitable energy (like thermal and/or mechanical energy) for rupturing the bonds at the zone of weakness, and thus detaching the rear portion from the semiconductor layer 50.

An optional step of finishing (by polishing, CMP, cleaning, . . . ) may be implemented after the reduction step, in order to have a smooth and homogeneous semiconductor layer 50. This finishing step may be implemented prior to or after the heat treatment below described. Other steps may also be provided, with no limitation according to the invention.

The obtained structure 60 comprises successively the substrate 10, the first oxide layer 20, the intermediate layer 30, the second oxide layer 40, and the thin semiconductor layer 50. A heat treatment according to the invention is then processed for reducing or removing the thickness of the second oxide layer 40. The heat treatment is implemented in an inert or reducing atmosphere, like argon or hydrogen atmosphere or a mixture of them.

Figure 2E:
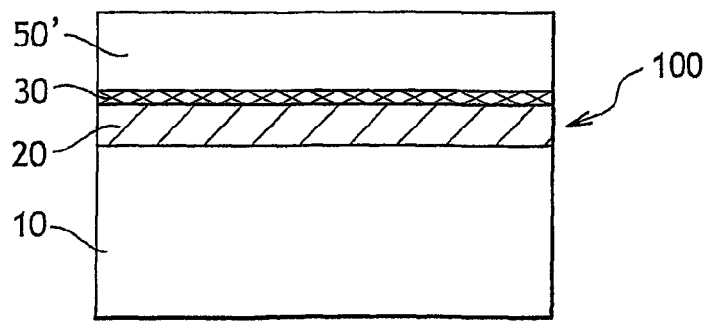

With reference to FIG. 2E, the heat treatment is processed such that the second oxide layer 40 reduces in thickness or is entirely dissolved, by oxygen diffusion through the semiconductor layer 50. The final structure 100 is a SeOI structure, with an insulator part formed by the first oxide layer 20, the intermediate layer 30 and the remaining part of the second layer 40 if the latter not entirely dissolved. The semiconductor part 50' of the SeOI structure 100 is the semiconductor layer 50 and the de-oxidized second oxide layer 40. During the heat treatment, it is to be noticed that a part of the semiconductor layer 50 may have been evaporated during oxide dissolution by the inert gas.

Figure 3:
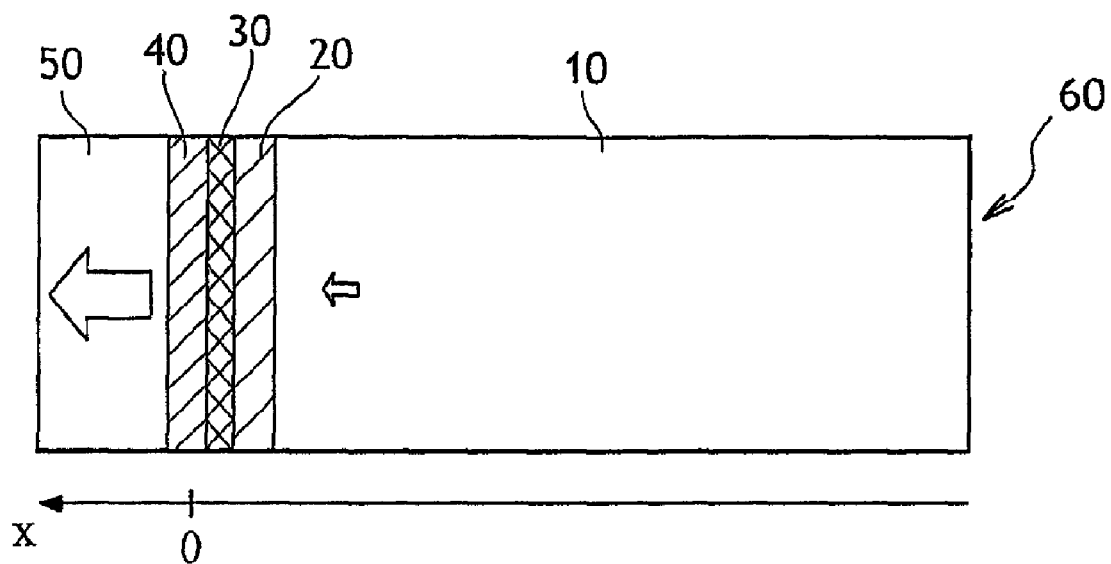
FIGS. 3 and 4 are schematic cross-section views of the structure, illustrating the diffusion phenomena.
Figure 4:
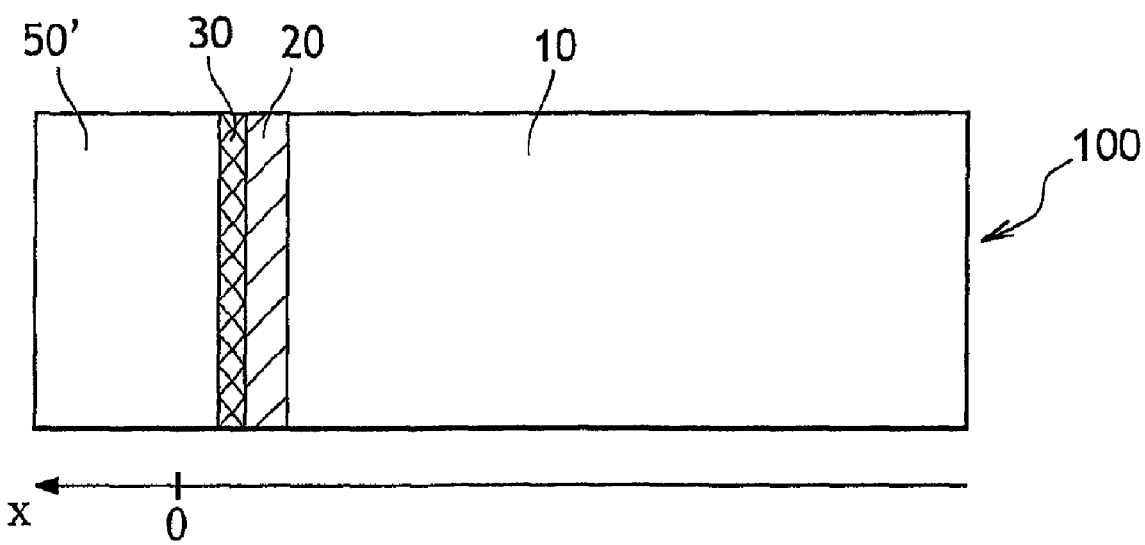

For illustrating the reduction of the second oxide layer 40 due to oxygen diffusion, FIGS. 3 and 4 show respectively a cross sectional view of the structure 60, one during diffusion and the other after diffusion. The structure 60 contains two diffusion domains:

left side (top semiconductor layer 50) and
right side (substrate 10—first oxide layer 20—intermediate layer 30);

separated by the second oxide layer 40 with a thickness $d_{ox}$.

It is assumed that the diffusion of oxygen is in one dimension—the diffusion equation is then:

$$\frac{\partial C(x, t)}{\partial t} = D(T) \frac{\partial^2 C(x, t)}{\partial x^2}$$

where: x-axis extends transversally to the layer planes, has its origin at the center of the second oxide layer 40, and is pointed to the positive value in the semiconductor layer 50, and to the negative value in the bulk substrate 10.

C(x, t) is the oxygen concentration at time t and at x.

D(T) is the diffusion coefficient of the oxygen in the semiconductor (unit: $cm^2/s$).

Figure 5:
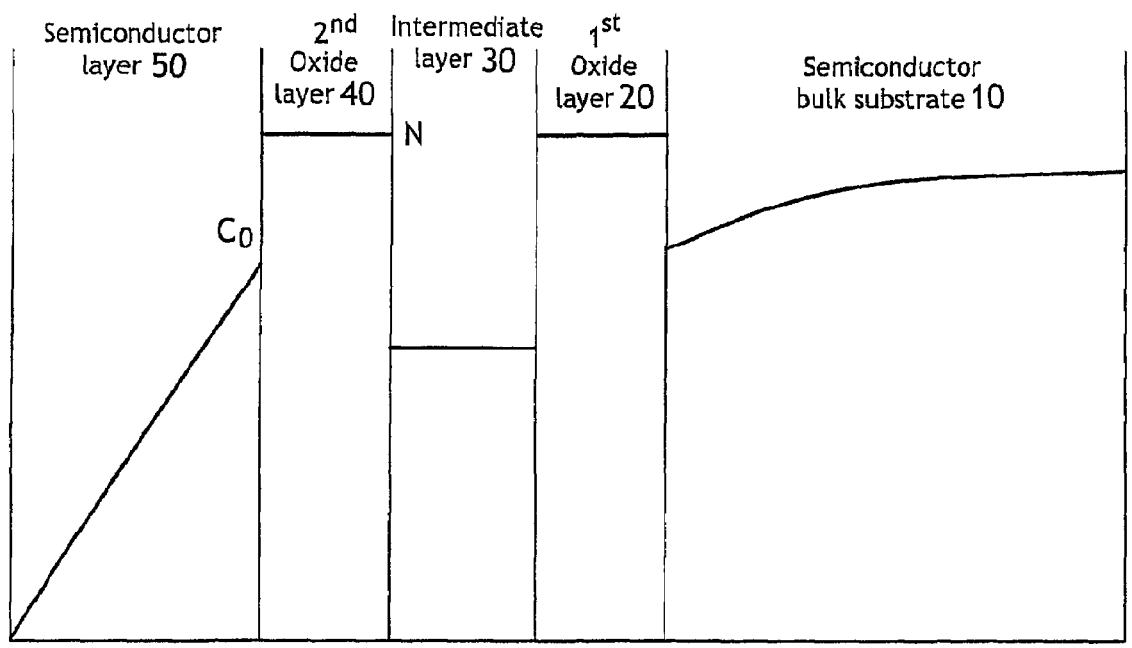
FIG. 5 is a graph showing distribution of oxygen inside the structure after a heat treatment according to the invention.
Figure 6:
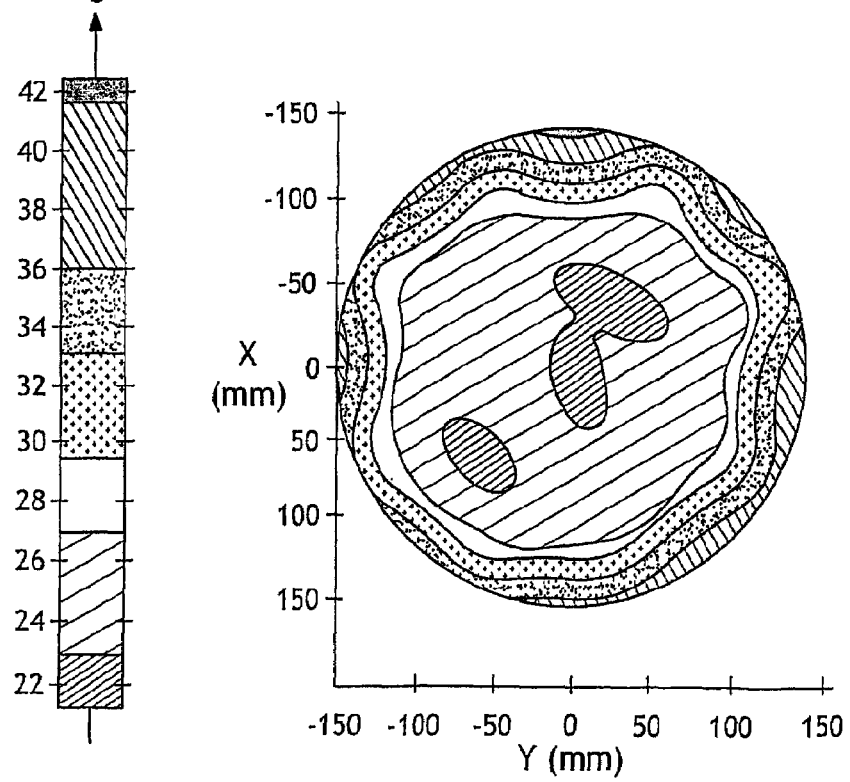
FIG. 6 shows difference of the BOX thickness of a heat-treated BOX in a SOI wafer after a heat treatment according to the invention, along the whole area of the BOX, measured by ellipsometry.

FIG. 5 schematically shows distribution of oxygen in the structure during the process of heat treatment. Oxide dissolution rate is the difference between the left oxygen flux through the semiconductor layer 50 (large arrow on FIG. 3) and the right oxygen flux in the bulk substrate 10 (small arrow on FIG. 3) at the oxide interfaces.

If the top semiconductor layer 50 is sufficiently thin, some oxygen of the second oxide layer 40 diffuses through it and evaporates in the atmosphere at the surface of it. This diffusion is accelerated by the fact that the atmosphere is chosen inert, as it can be deduced from the boundary conditions.

In particular, the following reaction occurs at the surface of a silicon layer 50 in the inert atmosphere:

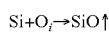

where $O_i$ is interstitial oxygen atoms in Si

For increasing the efficiency of this diffusion, a previous deoxidation of the surface of the semiconductor layer 50 may be done. The intermediate layer 30 prevents dissolution of the first oxide layer 20 and serves also as a stop layer to the dissolution of the second oxide layer 40.

Then, after a determined time and if the thickness of the semiconductor layer 50 is small with respect to the oxygen diffusion length $(D^*t)^{1/2}$, the applicant calculated that the diffusion time is acceptable. In this last case, the determined time is about 100 s, at about 1,200° C.

In such conditions the steady flux is defined as:

$$F=D(T)^*C_0(T)/d_{Se}$$

where: $d_{Se}$ is the thickness of the semiconductor layer 50
where $C_0(T)$ is the equilibrium oxygen solubility in the semiconductor at annealing temperature.

Oxide dissolution time for decreasing the second oxide layer 40 thickness $d_{ox}$ by a predetermined value $\Delta d_{ox}$, is:

$$\text{time} = \frac{d_{Se} * \Delta d_{ox}}{D(T)*C(T)} * N$$

where: N is the concentration of oxygen atoms in oxide.

For example, if the semiconductor layer 50 is of monocrystalline Si then N=4.22e22, and the second oxide layer 40 is of $SiO_2$, and if $d_{Se}$=1,000 angstroms and $\Delta d_{ox}$=20 angstroms:

time=1.86e-12*exp(4.04 eV/kT)

It has been demonstrated that the main parameter affecting the time is the anneal temperature and the thickness of the top semiconductor layer 50. For examples, and based on numerical simulation, the minimum annealing conditions to dissolve 20 angstroms of interfacial $SiO_2$, with 1,000 angstroms of top Si layer, in a Ar or H2 atmosphere, are:

1,100° C. for 2 hr, or
1,200° C. for 10 min, or
1,250° C. for 4 min.

The temperature and the duration of the heat treatment are then chosen for inciting an amount of oxygen of the second oxide layer 40 to diffuse through the semiconductor layer 50. Then, the thickness of the second oxide layer 40 decreases by a predetermined value. Additionally, the thickness of the semiconductor layer 50 may also have been chosen, when forming it, for inciting the diffusion.

Particularly, the thickness of the semiconductor layer 50 and the temperature of the heat treatment determine the mean reduction rate of the second oxide layer 40. More the thickness less the rate. More the temperature more the rate. For example, the thickness and temperature may be predetermined such that at least about 0.5 angstroms per minute of second oxide layer 40 mean reduction rate is reached. To this purpose, for a temperature of about 1,200° C., a thickness of a (110) Si monocrystalline layer 10 is chosen less than 2,500 angstroms. Only the duration of the heat treatment is then necessary to control for accurately reducing the thickness of the oxide layer 10 by a predetermined value.

Alternatively, the thickness of the semiconductor layer 50 has been chosen for reducing the second oxide layer 40 by a predetermined value by implementing the heat treatment with a predetermined duration and a predetermined temperature. The predetermined temperature may be chosen about 1,000° C. to 1,300° C., and especially around 1,100° C. or 1,200° C. The thickness of the semiconductor layer 50 may be between around 250 angstroms and around 1,000 angstroms, the predetermined temperature is about 1,200° C. and the predetermined duration is between around 5 minutes and 5 hours.

The heat treatment is processed for reducing the second oxide layer 40 by a predetermined thickness. By adjusting precisely the parameters of the heat treatment, it is then possible to control precisely the reduction of material in the second oxide layer 40, for finally having a second oxide layer 40 with a desired thickness. According to the invention, it is then possible to control precisely the thickness of a second oxide layer 40 of SeOI. Particularly, it is possible to remove the whole second oxide layer 40.

Additionally, the bonding between the semiconductor layer 50 and the substrate 10 can be done with a second oxide layer 40 having a thickness greater than a limit thickness beyond which the deformation of the semiconductor layer 50 and bubbles are avoided (as previously explained).

Furthermore, as risks of deterioration of the semiconductor layer 50 are decreased, the thickness of the latter can also be decreased, while still respecting manufacturing specifications. Thus, the components to be manufactured in the semiconductor layer 50 may be more miniaturized and have lower power consumption than the prior art. A main advantage of the invention is that the first oxide layer 20 is maintained in its initial configuration, even if the diffusing heat treatment is implemented. Indeed, the intermediate layer 30 stops its diffusion through the semiconductor layer 50.

Accordingly, the first oxide layer 20 is preserved from the heat treatments, and keeps its initial uniformity in thickness, its initial smoothness and its initial good interfacial quality. The dielectric properties of the first oxide layer 20 can then be initially calibrated very precisely, without taking account of the next heat treatment.

What is claimed is:

1. A process for controlling thickness of a buried oxide in a semiconductor structure that is to be used for electronics or optoelectronics applications, which comprises:
   preparing a structure comprising, successively, a substrate, a first oxide layer, an intermediate layer, a second oxide layer made of an oxide of a semiconductor material, and a semiconductor layer made of the semiconductor material, and
   heat treating the structure in an inert or reducing atmosphere at a temperature and a time sufficient to diffuse an amount of oxygen of the second oxide layer through the semiconductor layer to uniformly decrease the thickness of the second oxide layer to thus form a semiconductor structure comprising successively a substrate, a first oxide layer, an intermediate layer, a second oxide layer of reduced thickness, and a semiconductor layer.

2. The process of claim 1, which further comprises providing the intermediate layer of a material and with a thickness sufficient for stopping the diffusion of oxygen from the first oxide layer towards the semiconductor layer.

3. The process of claim 1, wherein the thickness of the semiconductor layer is between around 250 angstroms and around 5,000 angstroms, the heat treating temperature is about 1,200° C. and the treatment time is between around 5 minutes and 5 hours.

4. The process of claim 1, wherein the second oxide layer has a thickness between around 100 angstroms and around 500 angstroms before the heat treating.

5. The process of claim 1, wherein the heat treatment is processed so that the entire second oxide layer is removed.

6. A process of treating a structure for electronics or optoelectronics applications, which comprises heat treating a structure comprising, successively, a substrate, a first oxide layer having a thickness in the range of 50 to 500 Å and a uniformity around or better than 1%, an intermediate layer, a second oxide layer made of an oxide of a semiconductor material, and a semiconductor layer made of the semiconductor material, in an inert or reducing atmosphere at a temperature and a time sufficient to diffuse an amount of oxygen of the second oxide layer through the semiconductor layer to decrease the thickness of the second oxide layer to thus form a semiconductor structure comprising successively a substrate, a first oxide layer, an intermediate layer, a second oxide layer of reduced thickness, and a semiconductor layer.

7. The process of claim 6, wherein the intermediate layer has a thickness in the range of 20 to 200 Å and is of amorphous, polymorphous, monocrystalline, multicrystalline or polycrystalline silicon.

8. The process of claim 6, wherein the intermediate layer has a thickness in the range of 20 to 200 Å and is a nitride of the semiconductor material.

9. The process of claim 6, wherein the heat treatment is processed so that the entire second oxide layer is removed.

10. A process for manufacturing structure for electronics or optoelectronics applications, which comprises:
   providing a layer of a semiconductor material having a predetermined thickness;
   providing a receiving wafer comprising successively a substrate, a first oxide layer and a top layer;
   forming a bonding interface that includes as a bonding layer a second oxide layer made of an oxide of the same semiconductor material as that of the semiconductor layer;
   bonding the semiconductor layer to the receiving wafer at the bonding interface such that the first oxide layer and top layer are sandwiched between the semiconductor layer and the substrate, thus forming a structure comprising successively the substrate, the first oxide layer, an intermediate layer that includes the top layer, a second oxide layer of the bonding layer, and the semiconductor layer; and
   heat treating the structure in an inert or reducing atmosphere at a temperature and a time sufficient to diffuse an amount of oxygen from the second oxide layer through the semiconductor layer, wherein the intermediate layer has a thickness sufficient to stop diffusion of oxygen from the first oxide later towards the semiconductor layer.

11. The process of claim 10, wherein the second oxide layer is formed on the intermediate layer.

12. The process of claim 10, wherein the second oxide layer is formed on the semiconductor layer.

13. The process of claim 10, wherein the oxide layer of the bonding layer is formed on both the intermediate layer and the semiconductor layer.

14. The process of claim 10, wherein the thickness of the semiconductor layer is between around 250 angstroms and around 5,000 angstroms, the heat treating temperature is about 1,200° C. and the treatment time is between around 5 minutes and 5 hours.

15. The process of claim 10, wherein the intermediate layer has a thickness in the range of 20 to 200 Å, and is a nitride of the semiconductor material or is of amorphous, polymorphous, monocrystalline, multicrystalline or polycrystalline silicon.

16. The process of claim 10, wherein the semiconductor layer is provided as part of a donor substrate and which further comprises reducing the thickness of the donor substrate so that only the semiconductor layer is bonded to the receiving substrate.

17. The process of claim 16, wherein the thickness of the donor wafer is reduced by implanting atomic species in the donor substrate to form a zone of weakness beneath the semiconductor layer, and supplying energy for detaching the semiconductor layer from the donor structure at the zone of weakness.

18. The process of claim 10, wherein the heat treating temperature is firstly chosen according to a determined profile, and then the predetermined thickness is chosen for determining the duration or the duration is chosen for determining the predetermined thickness, these choices being made for reducing the thickness of the first oxide layer by a predetermined value.

19. The process of claim 18, wherein the temperature is between 1,100° C. and 1,250° C.

20. The process of claim 18, wherein the predetermined thickness and temperature are chosen for having a mean reduction rate of the first oxide layer of at least about 0.5 angstroms per minute.

* * * * *